United States Patent [19]
Sugden et al.

[11] Patent Number: 5,883,590
[45] Date of Patent: Mar. 16, 1999

[54] ANALOG TO DIGITAL CONVERTER USING UP/DOWN COUNTER AND DIGITAL FEEDBACK

[75] Inventors: David Mark Sugden, Harrogate; Andrew Martin Roberts, Leeds, both of England

[73] Assignee: Switched Reluctance Drives Limited, Harrogate, England

[21] Appl. No.: 833,081

[22] Filed: Apr. 4, 1997

[30] Foreign Application Priority Data

Apr. 4, 1996 [GB] United Kingdom .................... 9607229

[51] Int. Cl.[6] .................................................. H03M 1/12
[52] U.S. Cl. ............................................ 341/164; 341/155
[58] Field of Search ..................................... 341/155, 110, 341/144, 157, 169, 162, 164; 375/238

[56] References Cited

U.S. PATENT DOCUMENTS 4,143,361  3/1979  Tammes et al. ........................ 341/118
4,990,912  2/1991  Selwa ...................................... 341/132
5,519,397  5/1996  Chapotot et al. ....................... 341/155

OTHER PUBLICATIONS

"Intelligent Instrumentation: Microprocessor Applications in Measurement and Control." Barney, George C. Control Systems Centre, UMIST, Manchester.

Primary Examiner—Brian Young
Assistant Examiner—Peguy JeanPierre
Attorney, Agent, or Firm—Patterson & Keough, P.A.

[57] ABSTRACT

An analog to digital converter includes a comparator, an up/down counter and a pulse width modulator. The analog input to the comparator initially causes the counter to count up. The counter output is the converted digital word. The word is used to vary the modulation duty cycle of the modulator output which is compared with the analog input to the comparator. When the modulator output exceeds the analog input, the comparator output changes and the counter counts down, maintaining a digital output from the counter at the value of the converted analog signal.

13 Claims, 4 Drawing Sheets

ANALOG TO DIGITAL CONVERTER USING UP/DOWN COUNTER AND DIGITAL FEEDBACK

BACKGROUND OF THE INVENTION

1. Field of the Invention

This invention relates to an analog to digital converter.

2. Description of Related Art

Various techniques for converting analog signals into digital signals are known. They are discussed in, for example, "Intelligent Instrumentation—Microprocessor Applications in Measurement and Control" by Barney published by Prentice/Hall International (UK) Ltd.

Particularly for mass-produced items however, it is also desirable to be able to use low-cost components wherever possible as long as the quality of the converter remains acceptable for a given application.

The closed-loop technique of conversion is discontinuous. It takes a sample of an analog input, initiates a count and compares an analog version of the count value with the analog input. When parity is reached, the count stops and a digital output generated. Thus, the count starts at the same base value (usually zero) for each conversion which means the digital output is available only as quickly as the count can reach the correct value. This also means that the digital output is available after different conversion periods, depending on the analog value to be converted.

A form of continuous analog to digital conversion is possible using the simultaneous technique. However, it is rarely cost-effective as it requires $2^n-1$ comparators, which $n$ is the number of bits in the digital output.

SUMMARY OF THE INVENTION

It is one object of the invention to provide an analog to digital converter that tracks the analog value and is generally able to produce an updated output more quickly for a given count rate than known closed-loop converters.

It is also an object of the present invention to provide a cost-effective analog to digital converter.

According to an embodiment of the invention there is provided an analog to digital converter, comprising a comparator having a first input for an analog signal to be converted. A second input and a comparator output, an up/down counter, having a counter output, the counter being responsive to the comparator output to count up when the analog signal on the first input is greater than a feedback signal on the second input and to count down when the analog signal on the first input is less than a feedback signal on the second input, the converter further comprising a digital to analog converter arranged to convert the output of the counter and to apply the converted output thereof to the second input of the comparator as the feedback signal, the counter output being representative of the analog signal at the first input.

Embodiments of the invention enable the analog to digital conversion to be conducted as the value to be converted rises and falls, whereas the prior art closed-loop technique requires a count from the base value each time.

Embodiments of the invention are able to track the analog value as it rises and falls. This may be used to provide a substantially continuously updated digital output, using relatively simple circuitry.

Embodiments of the invention provide a versatile analog to digital converter that is producible using commonly available components. An embodiment of the invention does not require a sample-and-hold circuit. The slew rate of the converter is largely dictated by the count rate of the counter.

While various types of digital to analog converter are known, an embodiment of the present invention preferably comprises a pulse-width modulator arranged to receive the output of the counter and also a low-pass filter for smoothing the pulse width modulated output from the modulator, the output of the filter being the feedback signal applied to the second input.

The counter output will be a digital word. While the full digital word can be processed by the digital to analog converter, it is found that it is possible to process only a number of the most significant bits for the purposes of the invention.

The counter is preferably arranged to increment and decrement at a first rate and the modulator output is operable at a second rate which is less than the first rate.

Embodiments of the invention may include a clock and a frequency divider arranged to divide the output of the clock to derive the first and second rates.

BRIEF DESCRIPTION OF THE DRAWINGS

The present invention can be put into practice in various ways, one of which will now be described by way of example with reference to the accompanying drawings in which.

DETAILED DESCRIPTION OF PREFERRED EMBODIMENTS

Figure 1:
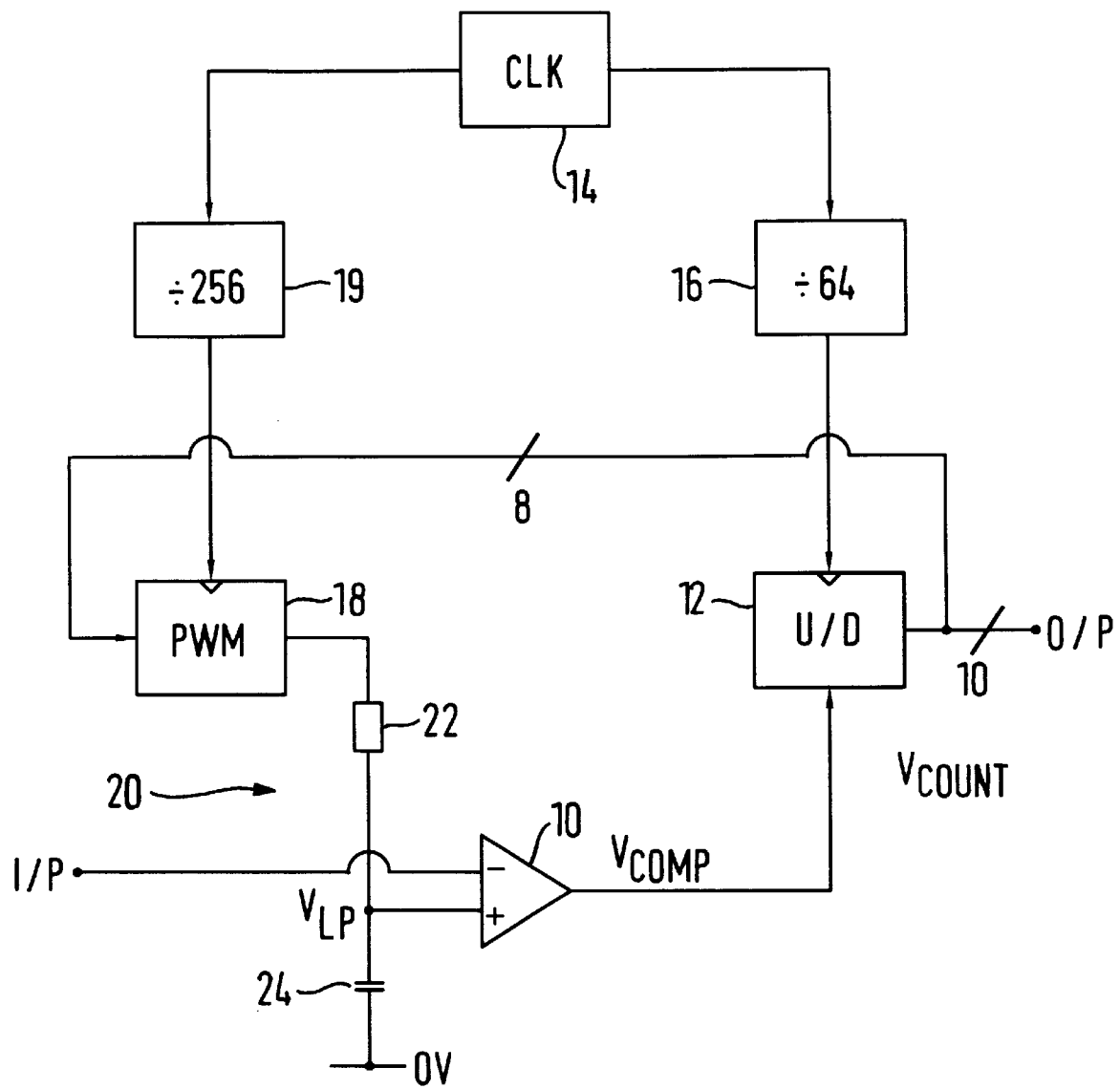
FIG. 1 is a schematic diagram of an analog to digital converter according to an embodiment of the invention.

Referring to FIG. 1 an analog to digital converter (ADC) comprises a comparator 10, having an inverting input which receives the analog signal to be converted. The output of the comparator 10 is connected as a command input to a 10-bit up/down counter 12 (U/D) which is driven by the output of a 10 MHz system clock 14 divided, in a frequency divider 16, by 64. The 10-bit word output of the counter 12 is the 10-bit digital word equivalent to the analog input.

Feedback control of the digital output is effected by supplying the eight most significant bits of the digital output from the counter 12 to an 8-bit pulse width modulator 18 (PWM) also driven by the 10 MHz system clock, but divided by 256 by a further frequency divider 19, giving a pulse width modulation frequency of 39.0625 kHz. The output of the pulse width modulator 18 is applied to a low-pass filter 20 which comprises a 1 kohm resistor 22 serially connected with a 100 nanofarad capacitor 24 to ground potential. The non-inverting input to the comparator 10 is connected between the resistor 22 and the capacitor 24.

For the purposes of illustration, it is convenient to consider the initial situation in which the counter 12 is cleared and the output of the modulator 18 is logic 0 (zero). A positive analog input signal applied to the inverting input of the comparator 10 causes the output of the comparator to be at logic 0. This is interpreted by the counter 12 as a command to count up at the clock rate divided by 64. The increasing magnitude of the count causes increasing modulation by the modulator 18 so that its duty cycle is increasingly greater. The pulse output from the modulator 18 is low-pass filtered to create a rising ramp that is applied to the non-inverting input to the comparator 10 as a feedback signal. As the level of the low-pass filtered signal rises, it will eventually exceed the analog input signal value. As this point, the output of the comparator will change to a logic 1 (one). This is interpreted by the counter as a count down command. Counter output is then decremented and the falling eight most significant bits, causing the previously rising ramp output of the low pass filter, then cause a falling ramp until the low pass filter signal falls below the analog input signal again. The counter output representing the digitized version of the analog input hunts about the steady input value.

Figure 2A:
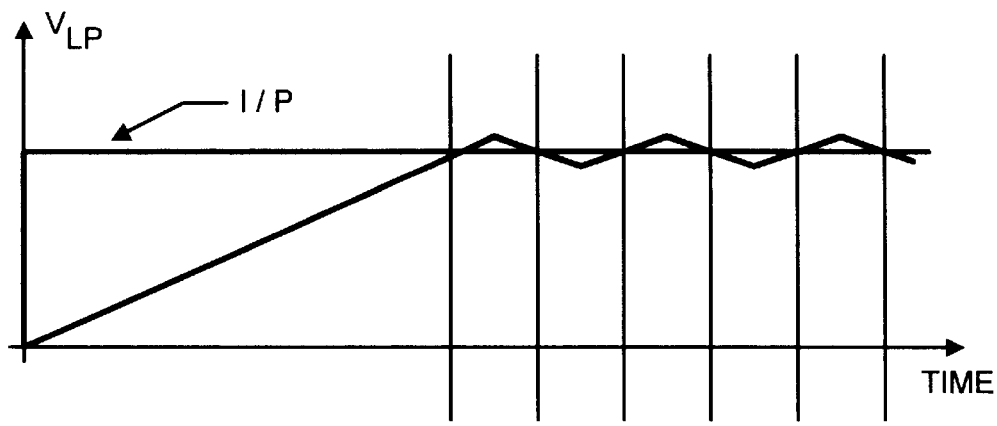
FIGS. 2(a), (b) and (c) are graphs illustrating the waveforms of the converter of FIG. 1.
Figure 2B:
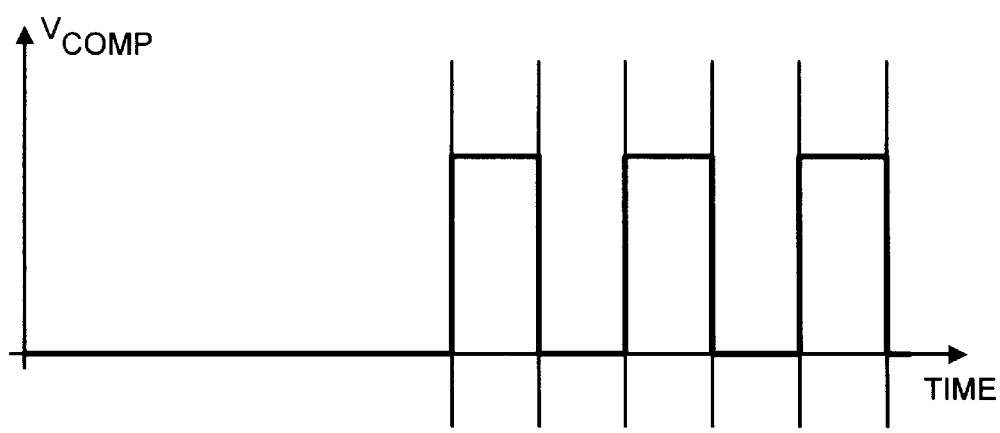
Figure 2C:
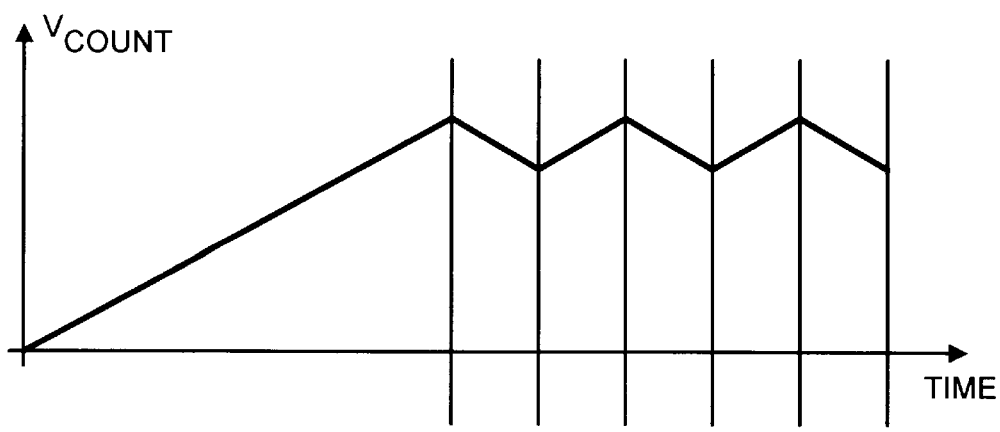

Simplified waveforms for a step analog input magnitude are shown in FIGS. 2(*a*), (*b*) and (*c*) for the low-pass filtered output $V_{LP}$, the comparator output $V_{COMP}$ and the up/down counter output, respectively. FIG. 2(*a*) shows the input signal rising to a steady value at time=0. This causes $V_{count}$ to rise, driving $V_{LP}$ up at the same time. When $V_{LP}$ crosses the analog value, the comparator switches and $V_{count}$ then decreases. It will be seen that the ten-bit output of the counter $V_{COUNT}$, which is the analog signal converted into a digital word, exhibits a ripple as it hunts, with the comparator output changing between logic 1 and logic 0. Embodiments of the invention are able to track rising and falling analog input signals and amend the digital output accordingly.

The degree of closeness of the digital value at the output of the counter to the analog input it represents is largely due to the speed of the counter. A greater correlation between the two will be achieved for a faster counter.

Figure 3:
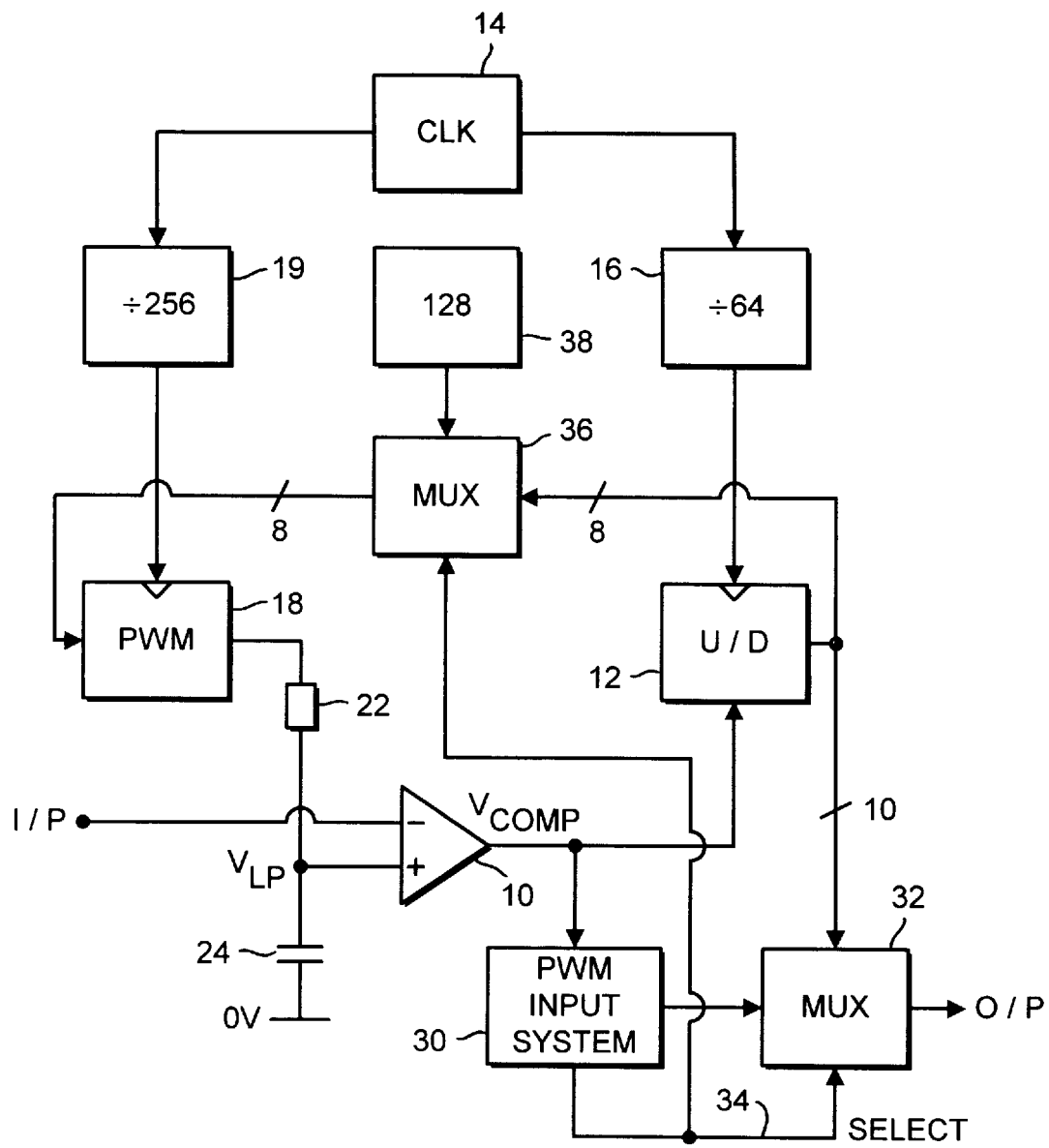
FIG. 3 is a schematic diagram of a dual pulse width modulation/analog input device incorporating an embodiment of the invention.

FIG. 3 illustrates an application of the invention as part of an application-specific integrated circuit (ASIC) for use as the controller for an electric motor in a washing machine drive. It will be apparent that washing machine manufacture is typical of high volume electrically driven goods where a cost-effective solution to implementing a controller can be of significant economic benefit. In this particular application the number of electrical connector pins available on the ASIC is limited and the extent to which a pin can serve different functions could allow a further function of the ASIC to be put into effect or release connector pins for other uses.

In FIG. 3 the circuit of FIG. 1 is repeated and like numerals have been used to denote the same parts. A pulse width modulation input system 30 is connected to the output of the comparator 10. The input system 30 provides a digital word proportional to the PWM input pulse width.

The output of the ADC according to an embodiment of the invention and the output of the pulse width modulation input system 30 are multiplexed by an output multiplexer 32 in accordance with a selection signal on line 34 from the input system 30 so that the output to the next stage of the ASIC is either selected to be a pulse width modulated signal, based on a digital pulse width modulated input, or one based on a 10-bit digital word derived from an analog input which is converted according to the invention. A further multiplexer 36 is also supplied with the output of the counter 12 and a digital register 38. This further multiplexer is also actuated by the selection signal on line 34 to pass either output to the pulse width modulator 18.

The output of the register 38 is a digital word corresponding to 50% modulation of the pulse width modulator output. In the case of the 8-bit modulator output in this embodiment, the value of the word is, therefore, 128.

In a particular application, an electric motor control signal may be a pulse width modulated signal or an analog signal which has to be converted into a digital demand, depending on the type of washing machine drive in a particular application. The ASIC according to embodiments of the invention is applicable to both situations. Therefore, the same ASIC can be manufactured to serve the two types of control input. The pulse width modulation input system 30 generates the selection signal which is indicative of no pulse width modulation signal being present at the output of the comparator. This signal is used on line 34 to actuate the multiplexers 32 and 36. Of course, the pulse width modulation input system could equally well generate a selection signal that was indicative of pulse width modulation present at the output of the comparator for the actuation of the multiplexers in the same way in the absence of the signal itself. In the case of the multiplexer 32 the output of the analog to digital converter according to the embodiment of the invention is passed when no pulse width modulation signal is detected. In the case of the multiplexer 36, the selection signal is used to pass the eight most significant bits from the 10-bit output of the counter 12 to the pulse width modulator in preference to the 128 value from the register 38.

On the other hand, when the input to the inverting input of the comparator is a pulse width modulated signal, the output of the pulse width modulation input system 30 causes the select signal on line 34 to actuate the multiplexer 32 to pass signals directly from the pulse width modulation input system 30 in preference to the output of the counter 12. The same signal actuates the multiplexer 36 to pass the 128 output from the register 38 in preference to the eight most significant bits of the output of the counter 12. The use of a 50% modulation factor is conveniently used as the constant threshold about which the comparator switches according to the incoming pulse width modulation signal. This provides evenly balanced modulation about a mid-point at the output of the comparator 10. Of course, biassing of the output of the comparator can be effected by shifting the modulation factor as necessary. Using the 50% modulation factor, the incoming pulse width modulated signal is compared with a substantially constant voltage of half peak-to-peak pulse voltage at the inverting input so that the output of the comparator is simply a balanced reproduction of the input pulse width modulation pulses.

It will be apparent to the skilled person that the arrangement of the invention shown in FIG. 3 is able automatically to decode an incoming pulse width modulated signal, or an analog signal requiring analog to digital conversion, and to relay or generate the appropriate pulse width modulated signals.

Figure 4:
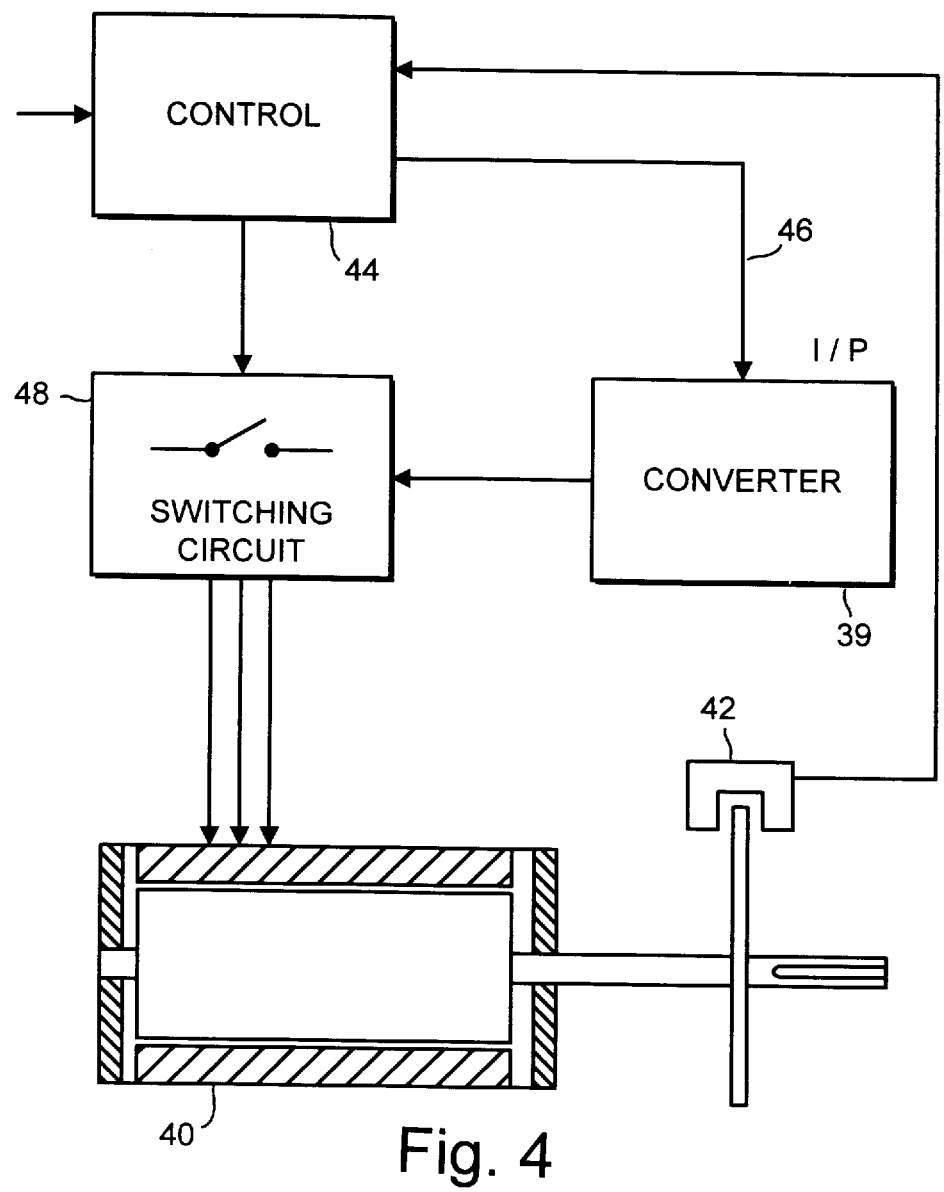
FIG. 4 is a schematic diagram of a switched reluctance drive incorporating the input device of FIG. 3.

A drive system for a switched reluctance motor is illustrated in FIG. 4 in which the converter of FIG. 3 is used as denoted by the numeral 39. A switched reluctance motor 40 has a rotor position encoder 42 arranged to detect the position of the rotor shaft. A controller 44 receives the rotor position information from the rotor position encoder 42 and a speed or torque demand signal is generated on line 46 which is the input to the inverting input of the comparator 10. In known manner, the controller computes the switch firing signals in accordance with the phase sequence, and the timing information from the rotor position encoder 42. The output of the controller may be a pulse width modulated signal, i.e. a digital command, or an analog voltage level, depending on the particular application. In either case the command signal is applied to the inverting input to the comparator 10 and the appropriate select signal is generated on line 34 according to whether pulse width modulation is detected or not. The output of the converter 39 is used to fire a switching circuit 48 for each of the phases of the motor 40 under the control of the controller 44.

While the invention has been described in relation to FIG. 3 in connection with an ASIC implementation, other forms and combinations of hardware and software could be used to equal effect. Thus, embodiments of the invention have been described in connection with the illustrated embodiments discussed above. Those skilled in the art will, however, recognize that many variations can be made without departing from the present invention. For example, the counter may have a different number of bits and may have the same number of bits as the pulse width modulation output. The digital to analog converter may take another known form. Also, while embodiments of the invention have been described in relation to a pulse width modulator, other forms of pulse modulation such as pulse amplitude modulation could be low-pass filtered to achieve an equivalent feedback signal. Accordingly, the above description of embodiments is by way of example and not for the purposes of limitation. The present invention is intended to be limited only by the scope of the following claims.

We claim:

1. An analog to digital converter, comprising:
   a comparator having a first input for an analog signal to be converted and a second input, the comparator having a comparator output;
   an up/down counter having a counter output;
   a digital to analog converter arranged to convert the counter output into a converter output and to apply the converter output to the second input of the comparator as a feedback signal, the counter being responsive to the comparator output to follow the analog signal at the first input, such that the counter output is substantially representative of the analog signal at the first input; and
   a first multiplexer arranged to receive the counter output and the output of the comparator and to select between the outputs in response to a command signal.

2. A converter as claimed in claim 1, in which the counter is responsive to an output of the comparator to count up when the analog signal on the first input is greater than the feedback signal on the second input, and to count down when the analog signal on the first input is less than the feedback signal on the second input.

3. A converter as claimed in claim 1, in which the digital to analog converter comprises a pulse modulator, arranged to receive the output of the counter, and a low-pass filter for smoothing the pulse width modulated output from the modulator, the output of the filter being the feedback signal applied to the second input.

4. A converter as claimed in claim 3, including clock means for driving the counter at a first rate and the modulator at a second rate slower than the first rate.

5. A converter as claimed in claim 1, including clock means for driving the counter at a first rate and a modulator, arranged to receive an output of the counter, at a second rate slower than the first rate.

6. A converter as claimed in claim 1, in which the counter is operable to produce an n-bit word, the digital to analog converter being arranged to receive the m most significant bits of the n-bit word.

7. A converter as claimed in claim 6, in which n is 10 and m is 8.

8. A converter as claimed in claim 1, including a second multiplexer arranged to receive the counter output and a predetermined digital word and to select between the counter output and the word in response to the command signal and to apply the selected counter output or word to the digital to analog converter.

9. A converter as claimed in claim 1, including a modulation detector arranged to detect modulation at the input to the comparator and operable to generate a signal indicative of a modulated signal at the first input to the comparator, the output of the detector being the said command signal.

10. An analog to digital converter, comprising:
    comparing means for generating a comparator output, the comparing means having a first input for an analog signal to be converted and a second input;
    counting means for up/down counting and generating a counter output;
    digital to analog converting means for converting the counter output into a converter output to the second input of the comparing means as a feedback signal, the counting means being responsive to the comparator output to follow the analog signal as the first input, such that the counter output is substantially representative of the analog signal at the first input; and
    first means for multiplexing arranged to receive the counter output and the comparator output and to select between the outputs in response to a command signal.

11. A converter as claimed in claim 10, wherein the counting means is responsive to an output of the comparing means to count up when the analog signal on the first input is greater than the feedback signal on the second input, and to count down when the analog signal on the first input is less than the feedback signal on the second input.

12. A converter as claimed in claim 10, wherein the digital to analog converting means comprises:
    pulse modulator means for receiving the output of the counting means; and
    low-pass filter means for smoothing the pulse width modulated output from the pulse modulator means, the output of the filter means being the feedback signal applied to the second output.

13. A converter as claimed in claim 10, further comprising second means for multiplexing arranged to receive the counter output and a predetermined digital word and to select between the counter output and the word in response to the command signal and to apply the selected counter output or word to the digital to analog converting means.

* * * * *